(12) United States Patent
Kurosawa et al.

(10) Patent No.: US 7,049,220 B2
(45) Date of Patent: May 23, 2006

(54) METHOD OF FORMING CAVITY BETWEEN MULTILAYERED WIRINGS

(75) Inventors: Takahiko Kurosawa, Tokyo (JP); Kaori Shirato, Tokyo (JP); Youichirou Maruyama, Tokyo (JP)

(73) Assignee: JSR Corporation, Tokyo (JP)

(*) Notice: Subject to any disclaimer, the term of this patent is extended or adjusted under 35 U.S.C. 154(b) by 42 days.

(21) Appl. No.: 10/693,929

(22) Filed: Oct. 28, 2003

(65) Prior Publication Data
US 2004/0132243 A1 Jul. 8, 2004

(30) Foreign Application Priority Data
Oct. 29, 2002 (JP) .................... P. 2002-314225

(51) Int. Cl.
*H01L 21/4763* (2006.01)
(52) U.S. Cl. .................. 438/619; 438/623; 438/780
(58) Field of Classification Search ............ 438/619, 438/623, 780; 257/40, 642
See application file for complete search history.

(56) References Cited

U.S. PATENT DOCUMENTS 6,165,890 A * 12/2000 Kohl et al. ............ 438/619
2002/0090831 A1* 7/2002 Yoshida et al. ......... 438/780

OTHER PUBLICATIONS

Shick et al., "New Olefinic Interlevel Dielectric Materials for Multi-Chip Modules", 1996, IEEE.*
U.S. Appl. No. 10/693,972, filed Oct. 28, 2003, Kurosawa et al.
U.S. Appl. No. 10/969,065, filed Oct. 21, 2004, Oshima, et al.

* cited by examiner

*Primary Examiner*—Michelle Estrada
(74) *Attorney, Agent, or Firm*—Oblon, Spivak, McClelland, Maier & Neustadt, P.C.

(57) ABSTRACT

A method of forming a cavity between metallic wirings using a polymer capable of revealing a specific heat resistant temperature and a specific heat decomposition temperature by having a specific repeating unit structure and a specific molecular weight range and of readily forming a cavity structure between metallic wirings in, for example, semiconductors. The method comprises a step of coating the surface of a first dielectric film formed on a semiconductor substrate with a cyclic olefin based addition polymer, a step of patterning the cyclic olefin based addition polymer as a void-forming polymer, a step of forming a metallic wiring in the pattern formed on the void-forming polymer, a step of forming a second dielectric film on the void-forming polymer containing a metallic wiring, and a step of removing the void-forming polymer between the multilayered wirings by heating to form a cavity between the metallic wirings.

7 Claims, 1 Drawing Sheet

METHOD OF FORMING CAVITY BETWEEN MULTILAYERED WIRINGS

FIELD OF THE INVENTION

The present invention relates to a method of forming a cavity between metallic wirings using a polymer capable of revealing a specific heat resistant temperature and a specific heat decomposition temperature by having a specific repeating unit structure and a specific molecular weight range and of readily forming a cavity structure between metallic wirings in, for example, semiconductors.

DESCRIPTION OF THE RELATED ART

Hitherto, silica ($SiO_2$) films formed by the vacuum process such as the CVD process have widely been employed as a dielectric film in semiconductors, etc. Further, coating type dielectric films containing a tetraalkoxysilane hydrolyzate as the major component and called an SOG (Spin on Glass) film are employed mainly for the purpose of flattening. In recent years, following large scale integration of semiconductor devices and the like, a demand for low-dielectric constant dielectric films is increasing for the purpose of reducing a wiring parasitic capacitance to improve the wiring delay. However, since relatively minute films are obtained by the CVD process, it is difficult to obtain a low dielectric constant of 2.5 or less. According to realization of a high porosity of SOG, since the dielectric constant increases with an increase in hygroscopicity following the realization of a high porosity, the effect of realizing a low dielectric constant by a reduction of film density is cancelled so that it is difficult to obtain low-dielectric constant films. While dielectric films with a low dielectric constant containing a polyorganosiloxane as the major component and called organic SOG are developed, in the case where it is intended to obtain a low dielectric constant of 2.3 or less, there is a problem such that a film strength necessary for formation processing of semiconductor devices is not obtained.

As the method of reducing a wiring parasitic capacitance, there are proposed semiconductor devices having a cavity between wirings as described in, for example, JP-A-9-172068, JP-A-8-83839, and JP-A-2001-85519.

However, according to those conventional methods, after preparing a structure in which a space between metallic wirings is filled with an organic resist or a silica compound, the organic resist or the silica compound is removed by etching or icing to form a cavity between the metallic wirings, and hence, there was involved a problem such that the operation is complicated.

The invention relates to a heat decomposable cyclic olefin based addition polymer capable of revealing a specific heat resistant temperature and a specific heat decomposition temperature by having a specific repeating unit structure and a specific molecular weight range. The cyclic olefin based addition polymer of the invention can be removed only by simple heat treatment without necessity of an operation such as etching and icing and has a mechanical strength that is sufficiently adaptive to the wiring processing process at temperatures of the heat resistant temperature or lower. Accordingly, it is possible to readily form a cavity structure between metallic wirings in semiconductors, etc., by using the cyclic olefin based addition polymer of the invention.

BRIEF DESCRIPTION OF THE DRAWING

The FIGURE is a view showing a process of the formation method of a cavity between metallic wirings according to the invention.

In the drawing:
1: Dielectric film 1
2: Polymer
3: Metal
4: Dielectric film 2
5: Cavity

DETAILED DESCRIPTION OF THE INVENTION

The invention will be described in detail below.

The invention provides a method of forming a cavity between multilayered wirings, which comprises a step of coating the surface of a first dielectric film formed on a semiconductor substrate with a cyclic olefin based addition polymer containing at least one repeating unit selected from repeating units represented by the following general formulae (1) to (7); a step of patterning the cyclic olefin based addition polymer as a void-forming polymer; a step of forming a metallic wiring in the pattern formed on the void-forming polymer; a step of forming a second dielectric film on the void-forming polymer between the multilayered wirings containing a metallic wiring; and a step of removing the void-forming polymer between the multilayered wirings by heating to form a cavity between the metallic wirings.

General formula (1)

wherein $A^1$ to $A^4$ each independently represents a hydrogen atom, a halogen atom, a hydrocarbon group having 1–10 carbon atoms or a halogenated hydrocarbon group having 1–10 carbon atoms; and m is 0 or 1.

General formula (2)

wherein $A^1$ to $A^4$ and m are the same as defined in the formula (1).

General formula (3)

wherein $B^1$ to $B^4$ each independently represents a hydrogen atom, a halogen atom, a hydrocarbon group having 1–10 carbon atoms, a halogenated hydrocarbon group having 1–10 carbon atoms, a hydrolyzable silyl group, or a polar group represented by —$(CH_2)_kX$; at least one of $B^1$ to $B^4$ represents a hydrolyzable silyl group or a polar group represented by —$(CH_2)_kX$; wherein X represents —$C(O)OR^{21}$ or —$OC(O)R^{22}$; $R^{21}$ and $R^{22}$ each represents hydrogen, a hydrocarbon group having 1–10 carbon atoms or a halogenated hydrocarbon group having 1–10 carbon atoms; k represents an integer of 0–3; $B^1$ to $B^4$ may be a hydrocarbon ring or a heterocyclic structure such as an imide or a carboxylic anhydride formed by $B^1$ and $B^3$ or $B^2$ and $B^4$, or an alkylidenyl, an imide or a carboxylic anhydride formed by $B^1$ and $B^2$ or $B^3$ and $B^4$; and p represents an integer of 0–2.

General formula (4)

wherein $R^1$ to $R^{14}$ each independently represents a hydrogen atom, a halogen atom, a hydrocarbon group having 1–10 carbon atoms or a halogenated hydrocarbon group having 1–10 carbon atoms.

General formula (5)

wherein $R^1$ to $R^{12}$ each independently represents a hydrogen atom, a halogen atom, a hydrocarbon group having 1–10 carbon atoms or a halogenated hydrocarbon group having 1–10 carbon atoms.

General formula (6)

wherein $R^1$ to $R^{16}$ each independently represents a hydrogen atom, a halogen atom, a hydrocarbon group having 1–10 carbon atoms or a halogenated hydrocarbon group having 1–10 carbon atoms.

General formula (7)

wherein $R^1$ to $R^{20}$ each independently represents a hydrogen atom, a halogen atom, a hydrocarbon group having 1–10 carbon atoms or a halogenated hydrocarbon group having 1–10 carbon atoms.

A repeating unit (1) that is contained in the cyclic olefin based addition polymer of the invention is formed by addition polymerizing a monomer selected from compounds represented by the following general formula (10) (the monomer will be hereinafter referred to as "specific monomer (1)").

General formula (10)

wherein $A^1$ to $A^4$, X, and m are the same as defined in the general formula (1).

As the specific monomer (1), one of the following compounds, or a combination of two or more thereof can be used, but it should not be construed that the invention is limited to these specific examples.

Bicyclo[2.2.1]hept-2-ene
5-Methylbicyclo[2.2.1]hept-2-ene
5-Ethylbicyclo[2.2.1]hept-2-ene
5-Propylbicyclo[2.2.1]hept-2-ene
5-Butylbicyclo[2.2.1]hept-2-ene
5,6-Dimethylbicylo[2.2.1]hept-2-ene
5-Methyl-5-ethyl-bicyclo[2.2.1]hept-2-ene
5-Fluorobicyclo[2.2.1]hept-2-ene
5-Chlorobicyclo[2.2.1]hept-2-ene
Tetracyclo[4.4.0.1$^{2,5}$.1$^{7,10}$]dodeca-3-ene
8-Methyltetracyclo[4.4.0.1$^{2,5}$.1$^{7,10}$]dodeca-3-ene
8-Ethyltetracyclo[4.4.0.1$^{2,5}$.1$^{7,10}$]dodeca-3-ene Of these, bicyclo[2.2.1]hept-2-ene, 5-methylbicyclo[2.2.1]hept-2-ene, 5,6-dimethylbicylo[2.2.1]hept-2-ene, tetracyclo[4.4.0.1$^{2,5}$.1$^{7,10}$]dodeca-3-ene, and 8-methyltetracyclo[4.4.0.1$^{2,5}$.1$^{7,10}$]dodeca-3-ene are preferably used from the standpoint of heat resistance of the resulting cyclic olefin based addition polymer.

When addition polymerization is carried out using the specific monomer (1), although the repeating unit (1) is mainly formed, a repeating unit (2) represented by the following general formula (2) is also formed during this. For example, in the general formula (10), when m is 0, the repeating unit (1) represents a repeating unit addition polymerized at the 2- and 3-positions, and the repeating unit (2) represents a repeating unit addition polymerized at the 2- and 7-positions. Further, in the general formula (10), when m is 1, the repeating unit (1) represents a repeating unit addition polymerized at the 3- and 4-positions, and the repeating unit (2) represents a repeating unit addition polymerized at the 3- and 11-positions.

General formula (2)

wherein $A^1$ to $A^4$ and m are the same as defined in the general formula (1).

Although quantitative determination of the repeating unit (2) in the cyclic olefin based addition polymer of the invention is difficult, it is possible to confirm the presence of the repeating unit (2) formed by addition polymerization at the 2- and 7-positions or the 3- and 11-positions by strong absorption found in the CH absorption region appearing at 45–55 ppm of the $^{13}$C-NMR spectrum (nuclear magnetic resonance spectrum).

The proportion of the components represented by the repeating units (1) and (2) in the cyclic olefin based addition polymer of the invention is usually 20 mol % or more, preferably 30 mol % or more, and more preferably 40 mol % or more in all of the repeating units from the standpoint of mechanical strength of the resulting cyclic olefin based addition polymer.

A repeating unit (3) contained in the cyclic olefin based addition polymer of the invention is formed by addition polymerizing a monomer selected from compounds represented by the following general formula (11) (the monomer will be hereinafter referred to as "specific monomer (3)").

General formula (11)

wherein $B^1$ to $B^4$ and p are the same as defined in the general formula (3).

As the specific monomer (3), one of the following compounds, or a combination of two or more thereof can be used, but it should not be construed that the invention is limited to these specific examples.

Examples of the specific monomer (3) having a polar group represented by —$(CH_2)_kX$ include the following compounds.

Bicyclo[2.2.1]hept-5-ene-2-carboxylic acid
2-Methylbicyclo[2.2.1]hept-5-ene-2-carboxylic acid
8-Methyl-8-carboxytetracyclo[4.4.0.1$^{2,5}$.1$^{7,10}$]dodeca-3-ene
Methyl bicyclo[2.2.1]hept-5-ene-2-carboxylate
Ethyl bicyclo[2.2.1]hept-5-ene-2-carboxylate
Butyl bicyclo[2.2.1]hept-5-ene-2-carboxylate
Methyl 2-methylbicyclo[2.2.1]hept-5-ene-2-carboxylate
Ethyl 2-methylbicyclo[2.2.1]hept-5-ene-2-carboxylate
Propyl 2-methylbicyclo[2.2.1]hept-5-ene-2-carboxylate
Butyl 2-methylbicyclo[2.2.1]hept-5-ene-2-carboxylate
Trifluoroethyl 2-methylbicyclo[2.2.1]hept-5-ene-2-carboxylate
Ethyl 2-methylbicyclo[2.2.1]hept-5-ene-2-acetate
2-Methylbicyclo[2.2.1]hept-5-enyl acrylate
2-Methylbicyclo[2.2.1]hept-5-enyl methacrylate
Dimethyl bicyclo[2.2.1]hept-5-ene-2,3-dicarboxylate
Diethyl bicyclo[2.2.1]hept-5-ene-2,3-dicarboxylate
8-Methyl-8-carboxymethyltetracyclo[4.4.0.1$^{2,5}$.1$^{7,10}$]dodeca-3-ene
8-Methyl-8-carboxyethyltetracyclo[4.4.0.1$^{2,5}$.1$^{7,10}$]dodeca-3-ene
Bicyclo[2.2.1]hept-5-ene-2,2-dicarboxylic acid anhydride
Bicyclo[2.2.1]hept-5-ene-2,3-dicarboxylic acid anhydride
N-Methyl-bicyclo[2.2.1]hept-5-ene-2,3-dicarboxylic acid imide
N-Phenyl-bicyclo[2.2.1]hept-5-ene-2,3-dicarboxylic acid imide
N-Propyl-bicyclo[2.2.1]hept-5-ene-2,3-dicarboxylic acid imide
N-Cyclohexyl-bicyclo[2.2.1]hept-5-ene-2,3-dicarboxylic acid imide
Bicyclo[2.2.1]hept-5-ene-2-spiro-N-methyl-succinimide
3-Methyl-bicyclo[2.2.1]hept-5-ene-2-spiro-N-methyl-succinimide
Bicyclo[2.2.1]hept-5-ene-2-spiro-N-propyl-succinimide
Bicyclo[2.2.1]hept-5-ene-2-spiro-N-cyclohexyl-succinimide
3-Methyl-bicyclo[2.2.1]hept-5-ene-2-spiro-N-cyclohexyl-succinimide
Tetracyclo[4.4.0.1$^{2,5}$.1$^{7,10}$]dodeca-8-ene-3-sprio-N-cyclohexyl-succinimide Further, as the hydrolyzable silyl group, groups represented by the following general formula (8) or (9) are desirably used.

General formula (8)

General formula (9)

In the formulae (8) and (9), $R^{23}$, $R^{24}$, and $R^{25}$ each independently represents a hydrogen atom, an alkyl group having 1–6 carbon atoms, a cycloalkyl group having 3–6 carbon atoms or an aryl group having 4–6 carbon atoms; $R^{26}$, $R^{27}$, and $R^{28}$ each independently represents a hydrogen atom, an alkyl group having 1–6 carbon atoms, a cycloalkyl group having 3–6 carbon atoms, an aryl group having 4–6 carbon atoms, an alkoxy group having 1–6 carbon atoms, an aryloxy group having 4–6 carbon atoms, or a halogen atom; n represents an integer of 0–5; and Y represents a hydrocarbon residue of an aliphatic diol, an alicyclic diol or an aromatic diol each having 2–26 carbon atoms.

Examples of the specific monomer (3) having a hydrolyzable silyl group represented by the general formula (8) include the following compounds.

5-[1'-Methyl-2',5'-dioxa-1'-silacyclopentyl]bicyclo[2.2.1]hept-2-ene
5-[1'-Methyl-3',3',4',4'-tetraphenyl-2',5'-dioxa-1'-silacyclopentyl]bicyclo[2.2.1]hept-2ene
5-[1',3',3',4',4'-Pentamethyl-2',5'-dioxa-1'-silacyclopentyl]bicyclo[2.2.1]hept-2-ene
5-[1'-Phenyl-2',5'-dioxa-1'-silacyclopentyl]bicyclo[2.2.1]hept-2-ene
5-[1'-Ethyl-2',5'-dioxa-1'-silacyclopentyl]bicyclo[2.2.1]hept-2-ene
5-[1',3'-Dimethyl-2',5'-dioxa-1'-silacyclopentyl]bicyclo[2.2.1]hept-2-ene
5-[1',3',4'-Trimethyl-2',5'-dioxa-1'-silacyclopentyl]bicyclo[2.2.1]hept-2-ene
5-[1'-Methyl-2',6'-dioxa-1'-silacyclohexyl]bicyclo[2.2.1]hept-2-ene
5-[1'-Ethyl-2',6'-dioxa-1'-silacyclohexyl]bicyclo[2.2.1]hept-2-ene
5-[1',3'-Dimethyl-2',6'-dioxa-1'-silacyclohexyl]bicyclo[2.2.1]hept-2-ene
5-[1',4',4'-Trimethyl-2',6'-dioxa-1'-silacyclohexyl]bicyclo[2.2.1]hept-2-ene
5-[1',4',4'-Trimethyl-2',6'-dioxa-1'-silacyclohexyl]methylbicyclo[2.2.1]hept-2-ene
5-[1',4',4'-Trimethyl-2',6'-dioxa-1'-silacyclohexyl]ethylbicyclo[2.2.1]hept-2-ene
5-[1'-Phenyl-4',4'-dimethyl-2',6'-dioxa-1'-silacyclohexyl]bicyclo[2.2.1]hept -2-ene
5-[1'-Methyl-4'-phenyl-2',6'-dioxa-1'-silacyclohexyl]bicyclo[2.2.1]hept-2-ene
5-[3'-Methyl-2',4'-dioxa-3'-silaspiro[5.5]undecyl]bicyclo[2.2.1]hept-2-ene
5-[1'-Methyl-4'-ethyl-4'-butyl-2',6'-dioxa-1'-silacyclohexyl]bicyclo[2.2.1]hept-2-ene
5-[1',3',3'-Trimethyl-5'-methylene-2',6'-dioxa-1'-silacyclohexyl]bicyclo[2.2.1]hept-2-ene
5-[1'-Phenyl-2',6'-dioxa-1'-silacyclohexyl]bicyclo[2.2.1]hept-2-ene
5-[1'-Methyl-3'-phenyl-2',6'-dioxa-1'-silacyclohexyl]bicyclo[2.2.1]hept-2-ene
5-[1',4',4'-Trimethyl-2',6'-dioxa-1'-silacyclohexyl]-7-oxabicyclo[2.2.1]hept -2-ene
5-[1'-Methyl-2',6'-dioxa-1'-silacyclohexyl]-7-oxabicyclo[2.2.1]hept-2-ene
5-[1'-Methyl-2',7'-dioxa-1'-silacycloheptyl]bicyclo[2.2.1]hept-2-ene
8-[1',4',4'-Trimethyl-2',6'-dioxa-1'-silacyclohexyl]tetracyclo[4.4.0.1$^{2,5}$.1$^{7,10}$]dodeca-3-ene
8-[1'-Methyl-2',6'-dioxa-1'-silacyclohexyl]tetracyclo[4.4.0.1$^{2,5}$.1$^{7,10}$]dodeca -3-ene Examples of the specific monomer (3) having a hydrolyzable silyl group represented by the general formula (9) include the following compounds.

5-Triethoxysilylbicyclo[2.2.1]hept-2-ene
5-Methyldiethoxysilylbicyclo[2.2.1]hept-2-ene
5-Methyldimethoxysilylbicyclo[2.2.1]hept-2-ene
5-Dimethylchlorosilylbicyclo[2.2.1]hept-2-ene
5-Methyldiethoxysilylbicyclo[2.2.1]hept-2-ene
5-Methyldichlorosilylbicyclo[2.2.1]hept-2-ene
5-Tripropoxysilylbicyclo[2.2.1]hept-2-ene
8-Triethoxysilyltetracyclo[4.4.0.1$^{2,5}$.1$^{7,10}$]dodeca-3-ene When the content of the repeating unit (3) having a polar group such as a hydrolyzable silyl group and an ester group is increased, it is possible to further improve adhesion or adhesiveness to other members. When a crosslinking agent described later is used, it is possible to convert the cyclic olefin based addition polymer of the invention into a crosslinked material. However, on the other hand, the increase of the content of the repeating unit (3) having a polar group introduces rises of water absorption and dielectric constant. Accordingly, it is desired that the proportion of the repeating unit (3) represented by the formula (3) in the cyclic olefin based addition polymer is 50 mol % or less, preferably 0.1–40 mol %, and more preferably 1–30 mol % in all of the repeating units.

Repeating units (4) to (7) contained in the cyclic olefin based addition polymer of the invention are formed by addition polymerization of monomers selected from compounds represented by the following general formulae (12) to (15) (the monomers will be hereinafter referred to as "specific monomers (4) to (7)").

General formula (12)

General formula (13)

General formula (14)

General formula (15)

In the formulae (12) to (15), $R^1$ to $R^{20}$ are the same as defined in the formulae (4) to (7).

As each of the specific monomers (4) to (7), one of the following compounds, or a combination of two or more thereof can be used, but it should not be construed that the invention is limited to these specific examples.

Tricyclo[5.2.1.0$^{2,6}$]deca-8-ene
1-Methyltricyclo[5.2.1.0$^{2,6}$]deca-8-ene
1-Methoxytricyclo[5.2.1.0$^{2,6}$]deca-8-ene
2-Methyltricyclo[5.2.1.0$^{2,6}$]deca-8-ene
5-Methyltricyclo[5.2.1.0$^{2,6}$]deca-8-ene
6-Methyltricyclo[5.2.1.0$^{2,6}$]deca-8-ene
6-Ethyltricyclo[5.2.1.0$^{2,6}$]deca-8-ene
9-Methyltricyclo[5.2.1.0$^{2,6}$]deca-8-ene
9-Ethyltricyclo[5.2.1.0$^{2,6}$]deca-8-ene
10-Methyltricyclo[5.2.1.0$^{2,6}$]deca-8-ene

10-Ethyltricyclo[5.2.1.0²,⁶]deca-8-ene
Tricyclo[4.2.0.1²,⁵]nona-3-ene
2-Methyltricyclo[4.2.0.1²,⁵]nona-3-ene
7-Methyltricyclo[4.2.0.1²,⁵]nona-3-ene
Tricyclo[6.2.1.0²,⁷]undeca-9-ene
1-Methyltricyclo[6.2.1.0²,⁷]undeca-9-ene
2-Methyltricyclo[6.2.1.0²,⁷]undeca-9-ene
2-Ethyltricyclo[6.2.1.0²,⁷]undeca-9-ene
8-Methyltricyclo[6.2.1.0²,⁷]undeca-9-ene
Tricyclo[8.2.1.0²,⁹]trideca-11-ene
2-Methyltricyclo[8.2.1.0²,⁹]trideca-11-ene
8-Methyltricyclo[8.2.1.0²,⁹]trideca-11-ene Of these, tricyclo[5.2.1.0²,⁶]deca-8-ene is preferably used from the standpoint of the balance between heat resistance and mechanical characteristic of the resulting cyclic olefin based addition polymer.

The repeating units (4) to (7) contained in the cyclic olefin based addition polymer of the invention are formed by addition polymerization of monomers selected from compounds represented by the following general formulae (16) to (22) (the monomers will be hereinafter referred to as "specific monomers (4') to (7')"), followed by hydrogenation.

General formula (16)

General formula (17)

General formula (18)

General formula (19)

General formula (20)

General formula (21)

General formula (22)

In the formulae (16) to (22), $R^1$ to $R^{18}$ are the same as defined in the formulae (4) to (7)

As each of the specific monomers (4') to (7'), one of the following compounds, or a combination of two or more thereof can be used, but it should not be construed that the invention is limited to these specific examples.

Tricyclo[5.2.1.0²,⁶]deca-3,8-diene
1-Methyltricyclo[5.2.1.0²,⁶]deca-3,8-diene
2-Methyltricyclo[5.2.1.0²,⁶]deca-3,8-diene
2-Ethyltricyclo[5.2.1.0²,⁶]deca-3,8-diene
5-Methyltricyclo[5.2.1.0²,⁶]deca-3,8-diene
6-Methyltricyclo[5.2.1.0²,⁶]deca-3,8-diene
6-Ethyltricyclo[5.2.1.0²,⁶]deca-3,8-diene
10-Methyltricyclo[5.2.1.0²,⁶]deca-3,8-diene
10-Ethyltricyclo[5.2.1.0²,⁶]deca-3,8-diene
Tricyclo[6.2.0.1²,⁷]undeca-3,9-diene
1-Methyltricyclo[6.2.0.1²,⁷]undeca-3,9-diene
2-Methyltricyclo[6.2.0.1²,⁷]undeca-3,9-diene
2-Ethyltricyclo[6.2.0.1²,⁷]undeca-3,9-diene
7-Chlorotricyclo[6.2.0.1²,⁷]undeca-3,9-diene
7-Fluorotricyclo[6.2.0.1²,⁷]undeca-3,9-diene
8-Methyltricyclo[6.2.0.1²,⁷]undeca-3,9-diene
Tricyclo[6.2.1.0²,⁷]undeca-4,9-diene
1-Methyltricyclo[6.2.1.0²,⁷]undeca-4,9-diene
2-Methyltricyclo[6.2.1.0²,⁷]undeca-4,9-diene
2-Ethyltricyclo[6.2.1.0²,⁷]undeca-4,9-diene
8-Methyltricyclo[6.2.1.0²,⁷]undeca-4,9-diene
Tricyclo[8.2.1.0²,⁹]trideca-3,11-diene
2-Methyltricyclo[8.2.1.0²,⁹]trideca-3,11-diene
8-Methyltricyclo[8.2.1.0²,⁹]trideca-3,11-diene
Tricyclo[8.2.1.0²,⁹]trideca-4,11-diene
2-Methyltricyclo[8.2.1.0²,⁹]trideca-4,11-diene
8-Methyltricyclo[8.2.1.0²,⁹]trideca-4,11-diene
Tricyclo[8.2.1.0²,⁹]trideca-4,11-diene
2-Methyltricyclo[8.2.1.0²,⁹]trideca-4,11-diene
9-Methyltricyclo[8.2.1.0²,⁹]trideca-4,11-diene Of these, tricyclo[5.2.1.0²,⁶]deca-3,8-diene is preferably used from the standpoint of the balance between heat resistance and mechanical characteristic of the resulting cyclic olefin based addition polymer.

In the case where the cyclic olefin based addition polymer of the invention is obtained using the specific monomers (4') to (7'), it is necessary to carry out hydrogenation after the addition polymerization. When olefinically unsaturated bonds are present in the polymer, the polymer is deteriorated by oxidation with oxygen at temperatures lower than 300° C.

or heat, and hence, such is not desirable. For this reason, the polymer is required such that 90 mol % or more, preferably 95 mol % or more, and more preferably 99 mol % or more of the unsaturated bonds are hydrogenated.

It is desirable that the cyclic olefin based addition polymer has a number average molecular weight (Mn) of 10,000–300,000, and preferably 10,000–120,000 and a weight average molecular weight (Mw) of 15,000–600,000, and preferably 15,000–300,000, as reduced into polystyrene by gel permeation chromatography measured at 120° C. using o-dichlorobenzene as a solvent.

In the case where the number average molecular weight is less than 10,000, or the weight average molecular weight is less than 15,000, when formed into a coating film, the coating film strength may possibly be insufficient, whereas in the case where the number average molecular weight exceeds 300,000, or the weight average molecular weight exceeds 600,000, when formed into a coating solution, the solution viscosity increases so that the film thickness uniformity of the resulting coating film may possibly be insufficient.

The cyclic olefin based addition copolymer of the invention is produced by addition copolymerization of at least one monomer selected from the specific monomers (1) to (7) and (4') to (7') in the presence of a nickel compound or a palladium compound as a catalyst component. The production method will be described below.

Examples of polymerization catalysts used include (A) a multicomponent catalyst containing the following components (1) to (3):

(1) a nickel compound or a palladium compound, (2) a compound selected from super-strong acids, Lewis acids, and ionic boron compounds, and (3) an organoaluminum compound; and (B) a nickel complex or a palladium complex having at least one sigma bond between nickel and carbon or between palladium and carbon and containing a super-strong acid anion as a counter anion. Of these, the multicomponent catalyst (A) is preferable because no complicated step is required for the synthesis.

(A) The multicomponent catalyst is constituted of the following components (1), (2) and (3).

(1) Nickel Compound: At least one compound selected from the following group:

Compounds selected from organic carboxylic acid salts, organic phosphorous acid salts, organic phosphoric acid salts, organic sulfonic acid salts, and β-diketo compounds of nickel. Examples include nickel acetate, nickel octanoate, nickel 2-ethylhexanoate, nickel naphthenate, nickel oleate, nickel versatate, nickel dibutylphosphite, nickel dibutylphosphate, nickel dioctylphosphate, a nickel salt of dibutyl phosphate, nickel dodecylbenzenesulfonate, nickel p-toluenesulfonate, bis(acetylacetonato)nickel, and bis(ethylacetoacetato)nickel.

Compounds in which the above organic carboxylic acid salts of nickel are modified with a super-strong acid such as hexafluoroantimonic acid, tetrafluoroboric acid, trifluoroacetic acid, and hexafluoroacetone;

Diene or triene coordination complexes of nickel, examples of which include nickel complexes such as dichloro(1,5-cyclooctadiene)nickel, [(η³-crotyl)(1,5-cyclooctadiene)nickel]hexafluorophosphate and tetrafluoroborate thereof, tetrakis[3,5-bis-(trifluoromethyl)]borate complex, (1,5,9-cyclododecatriene)nickel, bis(norbornadiene)nickel, and bis(1,5-cyclooctadiene)nickel; and Complexes in which a ligand having an atom such as P, N and O is coordinated in nickel, examples of which include nickel complexes such as bis(triphenylphosphine)nickel dichloride, bis(triphenylphosphine)nickel dibromide, bis(triphenylphosphine)cobalt dibromide, bis[tri(2-methylphenyl)phosphine]nickel dichloride, bis[tri(4-methylphenyl)phosphine]nickel dichloride, bis[N-(3-t-butyl-salicylidene)phenylaminato]nickel, Ni[PhC(O)CH](Ph), Ni(OC(C$_6$H$_4$)PPh)(H)(PCy$_3$), Ni[OC(O)(C$_6$H$_4$)P](H)(PPh$_3$), a reaction product of bis(1,5-cyclooctadiene)nickel and PhC(O)CH~PPh$_3$, and [2,6-(i-Pr)$_2$C$_6$H$_3$N~CHC$_6$H$_3$(O)(Anth)](Ph)(PPh$_3$)Ni (wherein Anth represents a 9-anthracenyl group, Ph represents a phenyl group, and Cy represents a cyclohexyl group).

Palladium compound: palladium acetate, palladium 2-ethylhexanonate, and bis-(acetylacetonato)palladium.

(2) Compound selected from super-strong acids, Lewis acids, and ionic boron compounds:

Examples of super-strong acids include hexafluoroantimonic acid, hexafluorophosphoric acid, hexafluoroarsenic acid, trifluoroacetic acid, trifluorosulfuric acid, trifluoromethanesulfonic acid, tetrafluoroboric acid, tetrakis-(pentafluorophenyl)boric acid, tetrakis[3,5-bis(trifluoromethyl)phenyl]boric acid, p-toluenesulfonic acid, and pentafluoropropionic acid.

Examples of Lewis acids include complexes of boron trifluoride with an ether, an amine, phenol, etc.; complexes of aluminum trifluoride with an ether, an amine, phenol, etc.; boron compounds such as tris(pentafluorophenyl)borane and tris[3,5-bis(trifluoromethyl)phenyl]borane; aluminum compounds such as aluminum trichloride, aluminum tribromide, ethylaluminum dichloride, ethylaluminum sesquichloride, diethylaluminum fluoride, and tri(pentafluorophenyl)aluminum; organic halogen compounds exhibiting Lewis acidity such as hexafluoroacetone, hexachloroacetone, chloranil, and hexafluoromethyl ethyl ketone; and other compounds exhibiting Lewis acidity such as titanium tetrachloride and pentafluoroantimonate.

Examples of ionic boron compounds include triphenylcarbenium tetrakis(pentafluorophenyl)borate, triphenylcarbenium tetrakis[3,5-bis(trifluoromethyl)phenyl]borate, triphenylcarbenium tetrakis(2,4,6-trifluorophenyl)borate, triphenylcarbenium tetraphenylborate, tributyl-ammonium tetrakis(pentafluorophenyl)borate, N,N-dimethylanilinium tetrakis(pentafluorophenyl)borate, N,N-diethylanilinium tetrakis(pentafluorophenyl)borate, and N,N-diphenylanilinium tetrakis(pentafluorophenyl)borate.

(3) Organoaluminum compound:

Examples of organoaluminum compounds that are suitably used include alkyl alumoxane compounds such as methyl alumoxane, ethyl alumoxane, and butyl alumoxane; alkylaluminum compounds and halogenated alkylaluminum compounds such as trimethylaluminum, triethylaluminum, triisobutylaluminum, diisobutylaluminum hydride, diethylaluminum chloride, diethylaluminum fluoride, ethylaluminum sesquichloride, and ethylaluminum dichloride; and mixtures of the above alkyl alumoxane compounds and the above alkylaluminum compounds. Especially, methyl alumoxane or an organoaluminum component containing methyl alumoxane is the most suitable because a reduction in polymerization activity is low in the case of using the specific monomer (3) containing a polar group.

(B) The nickel complex or palladium complex having at least one sigma bond between nickel and carbon or between palladium and carbon and containing a super-strong acid anion as a counter anion is represented by the following general formula (23).

$[L^1L^2ML^3]^+[An]^-$     General formula (23)

wherein M represents a nickel or palladium atom. $L^1$, $L^2$, and $L^3$ each represents a ligand of M; the carbon atom of at least one ligand is bonded to the metal atom by a sigma bond; and the other represents a compound selected from a cycloalkadiene having 6–12 carbon atoms, a norbornadiene, a cycloalkatriene having 10–20 carbon atoms, and an aromatic compound having 6–20 carbon atoms. [An] represents a non-coordinate or low-coordinate counter anion derived from a super-strong acid. The counter anion [An] is preferably $BF_4^-$, $PF_6^-$, $SbF_5SO_3F^-$, $AlF_3SO_3CF_3^-$, $AsF_6^-$, $SbF_6^-$, $CF_3CO_2^-$, $C_2F_5CO_2^-$, $CH_3C_6H_4SO_3^-$, $B[C_6F_5]_4^-$, or $B[3,5-(CF_3)_2C_6H_3]_4^-$.

Specific examples of the compound represented by the above general formula (23) include

[($\eta^3$-crotyl)Ni(cycloocta-1,5-diene)][B(3,5-$(CF_3)_2C_6F_3$)$_4$],
[($\eta^3$-crotyl)Ni(cycloocta-1,5-diene)][$PF_6$],
[($\eta^3$-allyl)Ni(cycloocta-1,5-diene)][B($C_6F_5$)$_4$],
[($\eta^3$-crotyl)Ni(cycloocta-1,5-diene)][$SbF_6$],
(6-methoxy-bicyclo[2.2.1]hept-2-ene-end-5σ,2π)Pd(cycloocta-1,5-diene)][$PF_6$],
(6-methoxy-bicyclo[2.2.1]hept-2-ene-end-5σ, 2π)Pd(cycloocta-1,5-diene)][$SbF_6$],
[(cycloocta-1,5-diene)Pd($CH_3$)Cl][B(($CF_3$)$_2C_6H_4$)$_3$],
[Pd($CH_3CN$)$_4$][$BF_4$]$_2$,
[Pd($C_6H_5CN$)$_4$][$BF_4$]$_2$,
[Pd($C_6H_5CN$)$_4$][$SbF_6$]$_2$,
[Pb(($C_6H_5$)$_3$P)$_2$][$SbF_6$]$_2$,
[(6-methoxy-bicyclo[2.2.1]hept-2-ene-end-5σ,2π)Pd(cycloocta-1,5-diene)][$PF_6$],
[(6-methoxy-bicyclo[2.2.1]hept-2-ene-end-5σ,2π)Pd(cycloocta-1,5-diene)][$SbF_6$],
[($\eta^3$-allyl)Pd][$SbF_6$] obtained from [($\eta^3$-allyl)PdCl]$_2$ and $AgSbF_6$,
[($\eta^3$-allyl)Pd][$BF_4$] obtained from [($\eta^3$-allyl)PdCl]$_2$ and $AgBF_4$,
[($\eta^3$-crotyl)Pd(cycloocta-1,5-diene)][$PF_6$], and
[$Ph_3PdCH_3$][B(($CF_3$)$_2C_6H_4$)$_3$].

However, it should not be construed that the invention is limited thereto.

These catalyst components are used in amounts of the following ranges.

The amount of the nickel compound or palladium compound (hereinafter referred to as "metal") is 0.02–100 mmoles-atom per mole of the monomer; the amount of the organoaluminum compound is 1–5,000 moles per one mole-atom of the metal; and the amount of the super-strong acid is 0.2–5.0 moles per one mole-atom of the metal. The amount of the Lewis acid is 0–50 moles per one mole-atom of the metal. Alternatively, the amount of the metal is 0.02–100 mmoles-atom per mole of the monomer; the amount of the organoaluminum compound is 1–5,000 moles per one mole-atom of the metal; and the amount of the ionic boron compound is 0.2–5.0 moles per one mole-atom of the metal.

In the case where a super-strong acid-modified nickel compound or palladium compound is used as the nickel compound or palladium compound (1) in the multicomponent catalyst (A) of the invention, the Lewis acid is not always necessary, but the addition of the Lewis acid further improves the polymerization activity. In the case where a chlorine-containing halogenated organoaluminum compound is used as the organoaluminum component, the addition of the Lewis acid is not always necessary.

With respect to the catalyst components of the invention, the addition of one or two or more compounds selected from super-strong acids, Lewis acids, and ionic boron compounds is necessary in the multicomponent catalyst (A), and the addition of a non-coordinate or low-coordinate counter anion derived from a super-strong acid is necessary in the monocomponent catalyst (B). By using such catalysts, the repeating unit (2) that is formed by addition polymerization at the 2- and 7-positions or addition polymerization at the 3- and 11-positions as derived from the specific monomer (1) is observed in the copolymer of the invention, and the dissolution property of the copolymer in toluene, cyclohexane, or a mixed solvent thereof at 25° C. increases.

The cyclic olefin based addition copolymer of the invention can be formed by polymerization in one or two or more solvents selected from alicyclic hydrocarbon solvents (such as cyclohexane, cyclopentane, or methylcyclopentane), aliphatic hydrocarbon solvents (such as hexane, heptane, or octane), aromatic hydrocarbon solvents (such as toluene, benzene, xylene, or mesitylene), and halogenated hydrocarbon solvents (such as chloromethane, dichloromethane, 1,2-dichloroethane, 1,1-dichloroethane, tetrachloroethane, chloroform, carbon tetrachloride, chlorocyclopentane, chlorocyclohexane, chlorobenzene, or dichlorobenzene) using the multicomponent catalyst (A) or monocomponent catalyst (B). Of these solvents, toluene, cyclohexane, dichloromethane, or a mixed solvent thereof is desirably used.

The polymerization is carried out in the following manner. That is, the solvent, the specific monomers (1) to (7) and/or (4') to (7'), and if desired, a molecular weight modifier are charged in a reactor in a nitrogen or argon atmosphere, and the polymerization system is set up at a temperature in the range of from −20° C. to 100° C. Next, the catalyst component is added, and polymerization is carried out at a temperature in the range of from −20° C. to 100° C. The weight ratio of the solvent to the monomer is in the range of 1/1 to 20/1. The molecular weight of the polymer is regulated by the amount of the polymerization catalyst and the addition amount of the molecular weight modifier, the conversion into the polymer, and the polymerization temperature. Examples of the molecular weight modifier include α-olefins (such as 1-hexene or 1-octene), aromatic vinyl compounds (such as styrene, 3-methylstyrene, 4-methylstyrene, 4-ethylstyrene, 3,5-dimethylstyrene, 1-vinylnaphthalene, or divinylbenzene), cyclic non-conjugated polyenes (such as cyclooctadiene or cyclododecatriene), diphenyl dihydrosilane, and hydrogen. Aromatic vinyl compounds are preferably used.

The polymerization is terminated with a compound selected from water, alcohols, organic acids, carbon dioxide gas, etc. The separation and removal of the catalyst residue may be properly carried out by known methods. For example, there is a method in which a water/alcohol mixture of an organic acid selected from maleic acid, fumaric acid, oxalic acid, malic acid, etc., is added to the polymer solution and separated from the aqueous layer. The catalyst residue may be removed by adsorption and removal using an adsorbing agent such as diatomaceous earth, alumina, and silica, or filtration and separation by a filter, etc.

The polymer is obtained by adding the polymer solution in an alcohol selected from methanol, ethanol, isopropanol, etc., followed by solidification and drying in vacuo. During this step, the unreacted monomers remaining in the polymer solution are also removed.

The olefinically unsaturated bond-containing addition copolymer obtained by polymerization using a monomer made of at least one member of the foregoing specific monomers (4') to (7') is hydrogenated using the following catalyst under the following condition.

The hydrogenation catalyst suitably used is selected from heterogeneous catalysts comprising nickel, rhodium, palladium, platinum, or the like supported on a solid such as silica, diatomaceous earth, alumina, and active carbon; homogeneous catalysts comprising a combination of a compound of titanium, nickel, palladium, cobalt, or the like and an organometallic compound; and catalysts comprising a complex of ruthenium, osmium, rhodium, iridium, or the like. Using aromatic hydrocarbons (such as toluene, xylene, ethylbenzene, or tetralin), alicyclic hydrocarbons (such as cyclohexane, methylpentane, methylcyclohexane, or decalin), and if desired, aliphatic hydrocarbons (such as hexane or heptane) and ethers (such as tetrahydrofuran, dimethoxyethane, or butyl ether) as a solvent, the hydrogenation condition is properly selected such that the hydrogen pressure is 0.5–15 MPa, and the temperature is in the range of 20–200° C.

Likewise the post treatment of the polymerization, the hydrogenated copolymer is treated with an organic acid and an adsorbing agent to remove the catalyst residue and solidified using steam or an alcohol, followed by separation and drying to recover the polymer.

The cyclic olefinic based addition polymer of the invention can be formed into a crosslinkable composition and a crosslinked material by the following methods.

(1) With respect to ones that are crosslinked with a radical, the following compositions and crosslinking methods are employed. During this, in cyclic olefin based addition polymers using the repeating unit (3) having a methacryloyl group or an acryloyl group in the side chain substituent, crosslinked materials can be more easily obtained.

(a) A composition compounded with a peroxide or an azo compound, and a method of crosslinking the composition by a radical generated by heat or active rays.

(b) A composition with a peroxide and a reducible metallic compound, and a method of crosslinking the composition by a radical generated by the redox reaction.

(2) With respect to ones in which the copolymer using a material having a hydrolyzable silyl group as the repeating unit (3) is crosslinked by hydrolysis and condensation reaction, the following compositions are used.

(a) A composition with an oxide, an alkoxide, a phenoxide, a β-diketonate, an alkylated material, a halide, an organic acid salt, or the like of a metal such as tin, aluminum, zinc, titanium, or antimony.

(b) A composition with a compound that acts as an acid upon heating, such as aromatic sulfonium salts, aromatic ammonium salts, aromatic pyridium salts, aromatic phosphonium salts, aromatic iodonium salts, hydrazinium salts, or ferrocenium salts, each having a counter anion selected from $BF_4$, $PF_4$, $AsF_6$, $SbF_6$, $B(C_6H_5)_4$, etc.

(c) A composition with a compound that acts as an acid upon heating in the presence of water or water vapor, such as trialkyl phosphorous acid esters, triaryl phosphorous acid esters, dialkyl phosphorous acid esters, monoalkyl phosphorous acid esters, hypophosphorous acid esters, secondary or tertiary alcohol esters of organic carboxylic acids, hemiacetal esters of organic carboxylic acids, or trialkylsilyl esters of organic carboxylic acids.

(d) A composition with a photo acid generator that forms a Bronsted acid or a Lewis acid upon irradiation of rays (such as g-rays, h-rays, i-rays, ultraviolet rays, far ultraviolet rays, X rays, or electron beams) such as onium salts (such as diazonium salts, ammonium salts, iodonium salts, sulfonium salts, phosphonium salts, arsenium salts, or oxonium salts), halogenated organic compounds (such as halogen-containing oxadiazole compounds, halogen-containing triazine compounds, halogen-containing acetophenone compounds, or halogen-containing benzophenone compounds), quinonediazide compounds, α,α-bis(sulfonyl)diazomethane compounds, α-carbonyl-α-sulfonyl-diazomethane compounds, sulfonyl compounds, organic acid ester compounds, organic acid amide compounds, and organic imide compounds.

(3) With respect to the copolymers using one having an ester group as the repeating unit (3), crosslinked materials can be obtained by crosslinking a composition comprising a polyhydric alcohol compound having 2–4 hydroxyl groups in one molecule and the metallic compound described above in (2)-(a) as the catalyst by the ester exchange reaction.

When the cyclic olefin based addition polymer of the invention is compounded with with a compound selected from these peroxides, azo compounds, and compounds described above in (2)-(a) to (2)-(d) including metallic compounds, acid-generating ester compounds, heat acid generators, photo acid generators, and polyhydric alcohol compounds to form a crosslinkable composition, it is possible to obtain a crosslinked material of the cyclic olefin based addition polymer within a short period of time under a relatively mild temperature condition of 10–280° C. The resulting crosslinked material of the cyclic olefin based addition polymer is enhanced in heat resistance and is more excellent in mechanical strength.

The compound that is used for the foregoing crosslinking is compounded and used in an amount in the range of 0.0001–5.0 parts by weight based on 100 parts by weight of the cyclic olefin based addition polymer of the invention.

The crosslinkable composition of the invention can also be further compounded with at least one compound selected from alkoxide compounds or aryloxide compounds of metals selected from silicon, titanium, aluminum, and zirconium, and condensates of these metal alkoxide compounds having a degree of condensation of 3–30. By compounding such a compound, when formed into a crosslinked material, the heat resistance and mechanical characteristic are improved. Specific examples include tetramethoxysilane, tetraethoxysilane, tetraisopropoxysilane, methyltrimethoxysilane, methyltriethoxysilane, dimethyldimethoxysilane, dimethyldiethoxysilane, cyclohexyltrimethoxysilane, cyclohexyltriethoxysilane, dicyclohexyldimethoxysilane, cyclopentyltrimethoxysilane, bicyclo[2.2.1]hept-2-yltrimethoxysilane, 2-bicyclo[2.2.1]hepten-5-yltrimethoxysilane, aluminum trimethoxide, aluminum triethoxide, titanium tetraethoxide, zirconium tetraethoxide, and condensates thereof having a degree of condensation of 3–30. Crosslinked materials can also be obtained by crosslinking a composition with a silane compound having a radical polymerizable substituent such as a methacryloyl group or an acryloyl group and a radical generator using light or heat.

In the composition, the alkoxide compound or aryloxide compound of a metal selected from silicon, titanium, aluminum, and zirconium, or the condensate thereof having a degree of condensation of 3–30 is preferably compounded in an amount of 5–60 parts by weight based on 100 parts by weight of the cyclic olefin based addition copolymer of the invention. In the case where the compounding amount is less than 5 parts by weight, the improving effect by the metal alkoxide compound or aryloxide compound or the condensate thereof having a degree of condensation of 3–30 is insufficient in terms of the hardness and elastic modulus of the resulting crosslinked material. On the other hand, in the case where it exceeds 60 parts by weight, the amount of the residue after the heat decomposition increases so that the cavity formation between metallic wirings may possibly be hindered.

Crosslinked materials may be obtained by using a composition compounded with metal oxide particles or colloidal particles having a mean particle size of not more than 100 nm (such as silica, alumina, zirconia, or titania) in addition to the alkoxide compound or aryloxide compound of a metal selected from silicon, titanium, aluminum, and zirconium, or the condensate thereof having a degree of condensation of 3–30.

The compounding amount of the metal oxide (compounding amount as reduced into solids content in the colloidal particles) is 1–20 parts by weight based on 100 parts by weight of the cyclic olefin based addition polymer of the invention. In the case where the compounding amount is less than 1 part by weight, the improving effect by the metal oxide is insufficient in terms of the hardness and elastic modulus of the resulting crosslinked material. On the other hand, in the case where it exceeds 20 parts by weight, the amount of the residue after the heat decomposition increases so that the cavity formation between metallic wirings may possibly be hindered.

The cyclic olefin based addition polymer of the invention has a weight loss on heating at 350° C. for one hour in an inert gas atmosphere and/or a vacuum atmosphere of 5 wt % or less and a weight loss on heating at 500° C. for one hour in an inert gas atmosphere and/or a vacuum atmosphere of 80 wt % or more. The heat decomposable cyclic olefin based addition polymer of the invention having a specific heat resistant temperature and a specific heat decomposition temperature can be removed only by simple heat treatment and has a mechanical strength that is sufficiently adaptive to the wiring processing process at temperatures not higher than the heat resistant temperature. Accordingly, it is possible to readily form a cavity structure between metallic wirings in semiconductors, etc. by using the heat decomposable cyclic olefin based addition polymer of the invention.

Examples of the inert gas include rare gases such as helium, neon, argon, krypton, xenon, and radon and nitrogen. As the inert gas to be used, ones having a purity of 99.9% or more are usually used. Above all, those having a purity of 99.99% or more are preferable, with those having a purity of 99.999% or more being particularly preferable. The inert gas preferably used is nitrogen, argon, or helium. The vacuum atmosphere is usually 100 Torr or less, preferably 10 Torr or less, and more preferably 1 Torr or less.

The cyclic olefin based addition polymer of the invention usually has a weight loss on heating at 350° C. for one hour in an inert gas atmosphere and/or a vacuum atmosphere of 5 wt % or less, preferably 3 wt % or less, and more preferably 1 wt % or less. The cyclic olefin based addition polymer of the invention is thermally stable at a temperature of 350° C. or lower at which processing of metallic wirings, etc., of semiconductor devices is usually carried out and therefore, is preferable as a material for formation processing of semiconductor devices.

The cyclic olefinic based addition polymer of the invention usually has a weight loss on heating at 500° C. for one hour in an inert gas atmosphere and/or a vacuum atmosphere of 80 wt % or more, preferably 90 wt % or more, more preferably 95 wt % or more, and most preferably 99 wt % or more. The cyclic olefin based addition polymer of the invention has good heat decomposition property at 500° C. or lower and can be removed only by a simple heat treatment without necessity of an operation such as etching and icing that is usually employed during the formation processing of semiconductor devices and also make it possible to easily form a cavity structure between metallic wirings in semiconductor devices, etc.

Further, the cyclic olefin based addition polymer of the invention usually has a glass transition temperature of 300° C. or higher, preferably 310° C., and more preferably 320° C. or higher. As described previously, the cyclic olefin based addition polymer of the invention has a high glass transition temperature, and hence, is preferable from the standpoints of the matters that even when exposed to high temperatures during the formation of metallic wirings in the semiconductor device, it does not exhibit a large change in volume following phase transition and keeps stability of the wiring shape.

The cyclic olefin based addition polymer of the invention has a mechanical strength sufficiently endurable to the formation processing of semiconductors. Specifically, since the cyclic olefin based addition polymer of the invention usually has an elastic modulus of 3.0 GPa or more, preferably 3.5 GPa or more, and more preferably 4.0 GPa or more, it can be adapted to the formation processing of semiconductor devices.

If desired, the cyclic olefin based addition polymer of the invention can be processed into a film shape and provided for the use. The film of the cyclic olefin addition polymer of the invention can be obtained by diluting the cyclic olefin addition polymer of the invention with an organic solvent, etc., then forming the solution into a film shape by various processes such as the spin coating process, the dip coating process, the roll coating process, the spray coating process, and the hot press process, the flow coating process, and optionally heating at a temperature of 350° C. or lower to remove the unnecessary organic solvent.

Figure 1A:
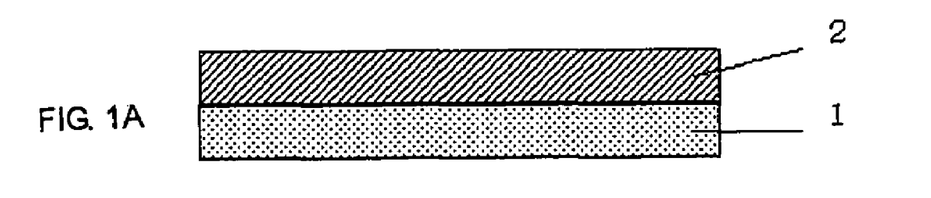
Figure 1B:
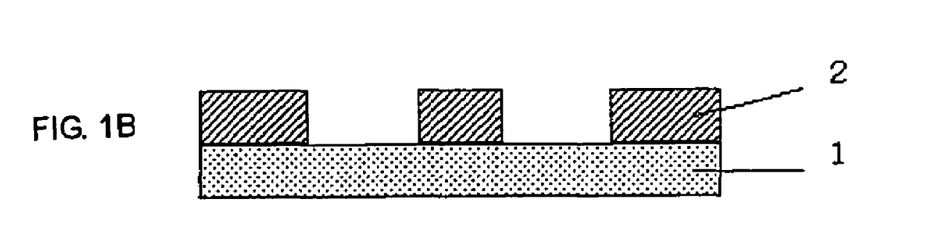
Figure 1C:
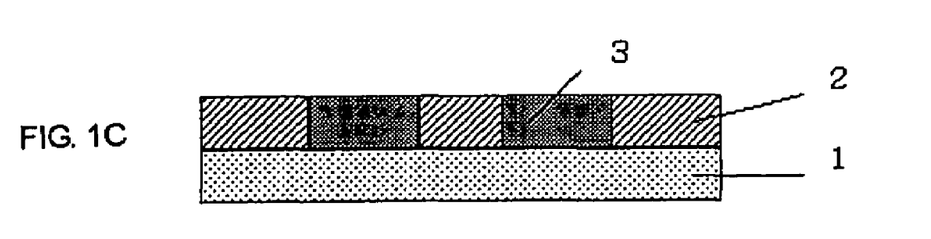
Figure 1D:
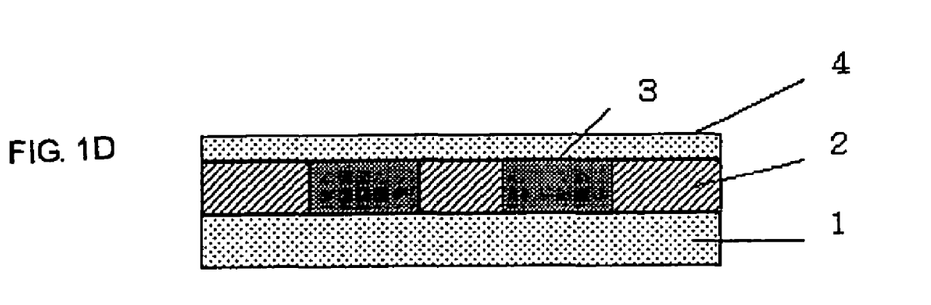
Figure 1E:
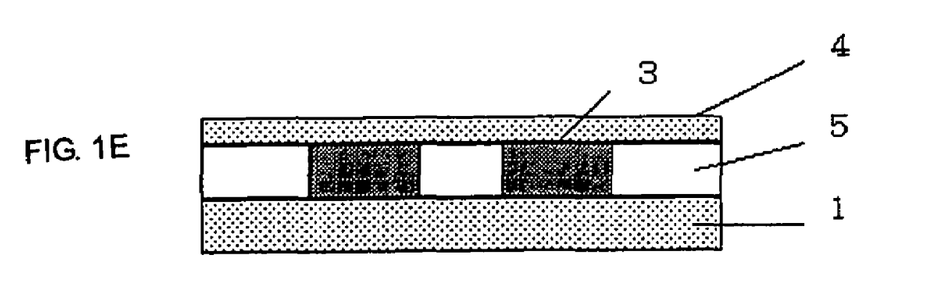

By using the cyclic olefin based addition polymer of the invention, it is possible to easily form a cavity structure between metallic wirings in semiconductor devices, etc. Specifically, for example, the polymer of the invention is applied to the surface of a prescribed first dielectric film of a semiconductor substrate (see FIG. 1A). The polymer is patterned in a space for forming a metallic wiring using the usual lithography technology and etching technology (see FIG. 1B). Further, a metal such as Cu, Al, W. and Mo is embedded in the pattern formed on the polymer by a conventional method such as plating or CVD (see FIG. 1C). For the purpose of preventing diffusion of the metal during embedding the metal, a layer of TaN, TiN, etc., may be formed between the foregoing polymer and the metal. After embedding the metal, the surface can be flattened by CMP. Next, a second dielectric film is formed on the polymer having the foregoing metal embedded therein by the usual spin process, the CVD process, or the like (see FIG. 1D). Finally, the polymer is removed upon heating, whereby a cavity can be formed between the metallic wirings (see FIG. 1E). The removal of the polymer can be carried out every layer of the multilayered metallic wirings or by repeating the steps of from FIG. 1A to FIG. 1D and then getting together some layers.

The invention will be described in more detail by reference to the following Examples. However, the Examples merely describe a summary of the embodiments of the invention, and it should not be construed that the invention is limited thereto without particular reasons.

All parts and percentages in the Examples and Comparative Example are parts by weight and % by weight, respectively, unless otherwise indicated.

Various evaluations were carried out in the following manners.

$^1$H-NMR:

The measurement was carried out in a mixed solvent of benzene-d6 and o-dichlorobenzene (volume ratio: 60/40) optionally upon heating at a resonance frequency of 270 MHz.

Weight Average Molecular Weight and Number Average Molecular Weight:

The measurement was carried out in o-dichlorobenzene as a solvent at 120° C. using a Model 150C gel permeation chromatograph (GPC) manufactured by Waters Corporation equipped with an H type column manufactured by Tosoh Corporation. The resulting molecular weighs are a value as reduced into standard polystyrene.

Dissolution Property:

In a glass-made vial (10 ml), 0.5 g of the cyclic olefin based addition polymer of the invention and 5 ml of an arbitrary solvent were charged, the mixture was stirred at 25° C. for 12 hours, and the resulting solution was visually observed and evaluated according the following criteria.

ⓔ: Dissolved (Insoluble matters are not found.)

×: Not dissolved (Insoluble matters are found.)

Weight Loss:

After heating in a nitrogen atmosphere at an arbitrary temperature for one hour, a weight loss was measured using SSC-5020/5200 manufactured by Seiko Instruments Inc. by the thermogravity (TG) process.

Glass Transition Temperature:

A glass transition temperature of the polymer was measured at a peak temperature of tan δ of dynamic viscoelasticity (a ratio of loss elastic modulus E" to storage elastic modulus E'; E"/E'=tan δ). The dynamic viscoelasticity was measured using a rheovibron DDV-01FP (manufactured by Orientec Co., Ltd.) and determined from a peak temperature of temperature dispersion of tan δ obtained at a measurement frequency of 10 Hz and a temperature-rising rate of 4° C./min with a single waveform of shaking mode and a shaking width of 2.5 μm.

Elastic Modulus:

The measurement was carried out using a nonaindenter XP (manufactured by MST, Inc.) by the nonaindentation process.

SYNTHESIS EXAMPLE

With respect to endo-tricyclo[5.2.1.0$^{2,6}$]deca-3,8-diene, one purified by distilling a commercially available product in vacuo was provided for use. An endo/exo ratio analyzed by gas chromatography was 99/1 or more.

With respect to endo-tricyclo[5.2.1.0$^{2,6}$]deca-8-ene, one synthesized by referring to the methods described in U.S. Pat. No. 4,139,569 and *Macromol. Chem.*, Vol. 95, 179 (1966) was subjected to distillation in vacuo using a distillation unit having a theoretical plate number of 40 plates so as to have a purity of 99% or more and an endo/exo ratio of 90/10 or 96/4 and then provided for use.

With respect to exo-tricyclo[5.2.1.0$^{2,6}$]deca-3,8-diene, one synthesized by referring to the methods described in *J. Am. Chem. Soc.*, 69, 2553 (1947) and *Synthesis*, 105 (1975) was subjected to distillation in vacuo so as to have a purity of 99% or more and an endo/exo ratio of 4/96 and then provided for use.

With respect to exo-tricyclo[5.2.1.0$^{2,6}$]deca-8-ene, one synthesized by referring to the methods described in *J. Am. Chem. Soc.*, 69, 2553 (1947), *J. Am. Chem. Soc.*, Vol. 82, 2351 (1960), and *Synthesis*, 105 (1975) was subjected to distillation in vacuo so as to have a purity of 99% or more and an endo/exo ratio of 10/90 and then provided for use.

With respect to endo-tricyclo[6.2.1.0$^{2,7}$]deca-3,9-diene, one prepared by subjecting dicyclopentadiene and 1,3-cyclohexadiene to the Diels-Alder reaction using the known measures and subjected to distillation in vacuo so as to have a purity of 99% or more and an endo/exo ratio of 85/15 was provided for use.

With respect to endo-tricyclo[4.4.0.1$^{2,5}$]trideca-3,11-diene, one prepared by subjecting dicyclopentadiene and 1,3-cyclooctadiene to the Diels-Alder reaction using the known measures and subjected to distillation in vacuo so as to have a purity of 99% or more and an endo/exo ratio of 80/20 was provided for use.

Example 1

47 g (500 mmoles) of bicyclo[2.2.1]hept-2-ene, 66 g (500 mmoles) of endo-tricyclo[5.2.1.0$^{2,6}$]deca-3,8-diene, 0.42 g (5 mmoles) of 1-hexene, and 480 g of toluene and 85 g of cyclohexane as solvents were placed in a 2 liters stainless steel-made reactor under nitrogen.

A solution of nickel octanoate in hexane and hexafluoroantimonic acid were reacted in a molar ratio of 1/1 at −10° C., a precipitate of nickel bis(hexafluoroantimonate)[Ni (SbF$_6$)$_2$] formed as a by-product was removed by filtration, and the residue was diluted with toluene. The resulting hexafluoroantimonic acid modified material of nickel octanoate (0.40 mmoles as a nickel atom), 1.2 mmoles of boron trifluoride ethyl etherate, 8.0 mmoles of methyl alumoxane, 0.4 mmoles of 1,5-cyclooctadiene, 8.0 mmoles of methyl triethoxysilane were charged in the order of methyl triethoxysilane, 1,5-cyclooctadiene, methyl alumoxane, boron trifluoride ethyl etherate, and the hexafluoroantimonic acid modified material of nickel octanoate, to initiate polymerization. The polymerization was carried out at 30° C. for 3 hours, and methanol was then added to terminate the polymerization. A conversion of the monomers into the copolymer was 73%.

The copolymer solution was diluted by the addition of 480 g of cyclohexane, to which were then added 660 ml of water and 48 mmoles of lactic acid. After thoroughly stirring and mixing, the reaction mixture was allowed to stand to separate the copolymer solution and an aqueous phase. The aqueous phase containing a reaction product of the catalyst components was removed, and the copolymer solution was added to 4 liters of isopropyl alcohol to solidify the copolymer, and the unreacted monomers and the catalyst residue were removed. The solidified copolymer was dried to obtain 75 g of a copolymer A. The content of the structural unit derived from endo-tricyclo[5.2.1.0$^{2,6}$]deca-3,8-diene in the copolymer A as measured from $^1$H-NMR was 37 mol %. (This value was calculated from a ratio of the absorption derived from the cyclopentene ring olefin structure of endo-tricyclo[5.2.1.0$^{2,6}$]deca-3,8-diene at 5.5–6.2 ppm to all protons of the norbornene ring at 0.7–3.3 ppm.) The copolymer A had a number average molecular weight (Mn) of 82,000 and a weight average molecular weight (Mw) of 151,000 as reduced into polystyrene, with an Mw/Mn ratio being 1.8.

Thirty grams of this copolymer A was dissolved in a mixed solvent of 285 g of cyclohexane and 285 g of toluene and hydrogenated at 180° C. for 4 hours under a hydrogen pressure of 8 MPa using 2.2 mg of a ruthenium catalyst represented by RuHCl(CO)[PPh$_3$]$_3$ in a 2 liters autoclave. After purging hydrogen, 50 g of diatomaceous earth (Radiolite #800, manufactured by Showa Chemical Industry Co., Ltd.) was added to the polymer solution, the mixture was stirred at 60° C. for 2 hours, and the diatomaceous earth was then filtered out. After the filtration, the hydrogenated polymer solution was washed with a lactic acid aqueous solution to remove the catalyst residue, and the residue was solidified with isopropyl alcohol to obtain 25 g of a hydrogenated polymer AH. The polymer AH had a degree of hydrogenation of 99% as determined by the $^1$H-NMR measurement. The results of the dissolution property and weight loss tests of the polymer AH are shown in Table 1.

10 g of the hydrogenated polymer AH was dissolved in 35.5 g of cyclohexane, to which was then added 1.0 part by weight, based on 100 parts by weight of the polymer, of pentaerythrityl tetrakis[3-(3,5-di-t-butyl-4-hydroxyphenyl) propionate] as an antioxidant. This polymer solution was formed into a film by the casting process and dried at 150° C. for 2 hours and further dried in vacuo at 200° C. for one hour, to prepare a film AH-1 having a thickness of 150 μm. The result of measurement of the glass transition temperature of the thus prepared film AH-1 is shown in Table 1.

3 g of the hydrogenated polymer AH was dissolved in 17 g of mesitylene and then coated on a silicon wafer by the spin coating process. Subsequently, the resulting silicon wafer was heat treated on a hot plate at 80° C. for 5 minutes in the air, on a hot plate at 200° C. for 5 hours in the air, and then in an oven at 350° C. for one hour in a nitrogen atmosphere, to obtain a coating film AH-2 having a thickness of 1 μm. The result of measurement of the elastic modulus of the resulting coating film AH-2 is shown in Table 1.

Example 2

Polymerization was carried out in the same manner as in Example 1, except for using 625 mmoles of bicyclo[2.2.1] hept-2-ene, 587 mmoles of endo-tricyclo[5.2.1.0$^{2,6}$]deca-3,8-diene, and 37 mmoles of 5-triethoxysilylbicyclo[2.2.1] hept-2-ene, to obtain a copolymer B in a conversion of 62%. A proportion of the structural unit derived from endo-tricyclo[5.2.1.0$^{2,6}$]deca-3,8-diene as determined from the $^1$H-NMR spectrum was 37 mol %. A proportion of the structural unit derived from 5-triethoxysilylbicyclo[2.2.1] hept-2-ene was 3.0 mol %. (This value was calculated from a ratio of the CH$_2$ absorption of the Si—O—CH$_2$— group at 3.7–4.1 ppm to the absorption of all of other protons.) The copolymer B had a number average molecular weight of 60,000 and a weight average molecular weight of 121,000 as reduced into polystyrene, with an Mw/Mn ratio being 2.0.

Hydrogenation was carried out in the same manner as in Example 1 at 120° C. for 4 hours under a hydrogen pressure of 8 MPa using the same solvent and catalyst, except for using the copolymer B in place of the copolymer A. The polymer solution was treated in the same measure as in Example 1 to obtain a hydrogenated polymer BH. The polymer BH had a degree of hydrogenation of 99% as determined by the $^1$H-NMR measurement. The results of the dissolution property and weight loss tests of the polymer BH are shown in Table 1.

A film BH-1 was prepared using the copolymer BH in the same measure as in Example 1. The result of measurement of the glass transition temperature of the thus prepared film BH-1 is shown in Table 1.

A coating film BH-2 was obtained using the copolymer BH in the same measure as in Example 1. The result of measurement of elastic modulus of the resulting coating film BH-2 is shown in Table 1.

Example 3

Polymerization was carried out in the same manner as in Example 1, except for using 625 mmoles of bicyclo[2.2.1] hept-2-ene, 587 mmoles of endo-tricyclo[5.2.1.0$^{2,6}$]deca-3,8-diene, and 37 mmoles of 5-[1',4',4'-trimethyl-2',6'-dioxa-1'-silacyclohexyl]bicyclo[2.2.1]hept-2-ene, to a copolymer C. A conversion into the copolymer was 60%. In the copolymer C, a proportion of the structural unit derived from endo-tricyclo[5.2.1.0$^{2,6}$]deca-3,8-diene as determined from the $^1$H-NMR spectrum was 36 mol %. A proportion of the structural unit derived from 5-[1',4',4'-trimethyl-2',6'-dioxa-1'-silacyclohexyl]bicyclo-[2.2.1]hept-2-ene was 3.0 mol %. (This value was calculated from a ratio of the CH$_2$ absorption of the Si—O—CH$_2$— group at 3.4–4.0 ppm to the absorption of all of other protons.) The copolymer C had a number average molecular weight of 116,000 and a weight average molecular weight of 278,000 as reduced into polystyrene, with an Mw/Mn ratio being 2.4.

Hydrogenation and post treatment were carried out using the copolymer C in the same measure as in Example 2, to obtain a hydrogenated polymer CH. The polymer CH had a degree of hydrogenation of 99% as determined by the $^1$H-NMR measurement. The results of the dissolution property and weight loss tests of the polymer CH are shown in Table 1.

A film CH-1 was prepared using the copolymer CH in the same measure as in Example 1. The result of measurement of the glass transition temperature of the thus prepared film CH-1 is shown in Table 1.

A coating film CH-2 was obtained using the copolymer CH in the same measure as in Example 1. The result of measurement of elastic modulus of the resulting coating film CH-2 is shown in Table 1.

Example 4

Polymerization was carried out in the same manner as in Example 3, except for using 78 g of toluene, 168 g of cyclohexane, and 164 g of methylene chloride as solvents, to obtain a copolymer D in a conversion of 93%. In the copolymer D, a proportion of the structural unit derived from endo-tricyclo[5.2.1.0$^{2,6}$]deca-3,8-diene as determined from the $^1$H-NMR spectrum was 40 mol %. A proportion of the structural unit derived from 5-[1',4',4'-trimethyl-2',6'-dioxa-1'-silacyclohexyl]bicyclo[2.2.1]hept-2-ene was 3.0mol %.

The copolymer D had a number average molecular weight of 112,000 and a weight average molecular weight of 224,000 as reduced into polystyrene, with an Mw/Mn ratio being 2.0.

The copolymer D was hydrogenated in the same measure as in Example 2 to obtain a hydrogenated polymer DH. The polymer DH had a degree of hydrogenation of 99% as determined by the $^1$H-NMR measurement. The results of the dissolution property and weight loss tests of the polymer DH are shown in Table 1.

A film DH-1 was prepared using the copolymer DH in the same measure as in Example 1. The result of measurement of the glass transition temperature of the thus prepared film DH-1 is shown in Table 1.

A coating film DH-2 was obtained using the copolymer DH in the same measure as in Example 1. The result of measurement of elastic modulus of the resulting coating film DH-2 is shown in Table 1.

Example 5

Polymerization was carried out in the same manner as in Example 4, except for using 587 mmoles of endo-tricyclo[5.2.1.0$^{2,6}$]deca-8-ene (endo/exo=96/4) as a monomer in place of the endo-tricyclo[5.2.1.0$^{2,6}$]deca-3,8-diene, to obtain a copolymer E in a conversion of 90%.

In the copolymer E, a proportion of the structural unit derived from 5-[1',4',4'-trimethyl-2',6'-dioxa-1'-silacyclohexyl]bicyclo[2.2.1]hept-2-ene as determined from the $^1$H-NMR spectrum was 2.8 mol %. A proportion of the structural unit derived from endo-tricyclo[5.2.1.0$^{2,6}$]deca-8-ene in the copolymer E was determined by quantitative determination of the unreacted monomers after completion of the polymerization by gas chromatographic analysis and found to be 39 mol %. The copolymer E had a number average molecular weight of 108,000 and a weight average molecular weight of 211,000 as reduced into polystyrene, with an Mw/Mn ratio being 2.0. The results of the dissolution property and weight loss tests of the polymer E are shown in Table 1.

A film E-1 was prepared using the copolymer E in the same measure as in Example 1. The result of measurement of the glass transition temperature of the thus prepared film E-1 is shown in Table 1.

A coating film E-2 was obtained using the copolymer E in the same measure as in Example 1. The result of measurement of elastic modulus of the resulting coating film E-2 is shown in Table 1.

Example 6

Polymerization was carried out in the same manner as in Example 2, except for using 37 mmoles of 5-(methyldiethoxysilyl)bicyclo[2.2.1]hept-2-ene as a monomer in place of the 5-triethoxysilylbicyclo[2.2.1]hept-2-ene, to obtain a copolymer F in a conversion of 52%.

In the copolymer F, a proportion of the structural unit derived from endo-tricyclo[5.2.1.0$^{2,6}$]deca-3,8-diene as determined from the $^1$H-NMR spectrum was 34 mol %. A proportion of the structural unit derived from 5-(methyldiethoxysilyl)bicyclo[2.2.1]hept-2-ene was 2.5 mol %. (This value was calculated from a ratio of the CH$_2$ absorption of the Si—O—CH$_2$— group at 3.6–4.0 ppm to the absorption of all of other protons.) The copolymer F had a number average molecular weight of 72,000 and a weight average molecular weight of 165,000 as reduced into polystyrene, with an Mw/Mn ratio being 2.3.

The copolymer F was hydrogenated in the same measure as in Example 2 to obtain a hydrogenated polymer FH. The polymer FH had a degree of hydrogenation of 99% as determined by the $^1$H-NMR measurement. The results of the dissolution property and weight loss tests of the polymer FH are shown in Table 1.

A film FH-1 was prepared using the copolymer FH in the same measure as in Example 1. The result of measurement of the glass transition temperature of the thus prepared film FH-1 is shown in Table 1.

A coating film FH-2 was obtained using the copolymer FH in the same measure as in Example 1. The result of measurement of elastic modulus of the resulting coating film FH-2 is shown in Table 1.

Example 7

Polymerization was carried out in the same manner as in Example 4, except for using 1,020 mmoles of bicyclo[2.2.1]hept-2-ene, 190 mmoles of endo-tricyclo[5.2.1.0$^{2,6}$]deca-3,8-diene, and 40 mmoles of 5-triethoxysilylbicyclo[2.2.1]hept-2-ene as monomers, to obtain a copolymer G in a conversion of 92%. In the copolymer G, a proportion of the structural unit derived from endo-tricyclo[5.2.1.0$^{2,6}$]deca-3,8-diene as determined from the $^1$H-NMR spectrum was 15 mol%. A proportion of the structural unit derived from 5-triethoxysilylbicyclo[2.2.1]hept-2-ene was 3.0 mol%. The copolymer G had a number average molecular weight of 72,000 and a weight average molecular weight of 143,000 as reduced into polystyrene, with an Mw/Mn ratio being 2.0.

The copolymer G was hydrogenated in the same measure as in Example 2 to obtain a hydrogenated polymer GH. The polymer GH had a degree of hydrogenation of 99% as determined by the $^1$H-NMR measurement. The results of the dissolution property and weight loss tests of the polymer GH are shown in Table 1.

A film GH-1 was prepared using the copolymer GH in the same measure as in Example 1. The result of measurement of the glass transition temperature of the thus prepared film GH-1 is shown in Table 1.

A coating film GH-2 was obtained using the copolymer GH in the same measure as in Example 1. The result of measurement of elastic modulus of the resulting coating film GH-2 is shown in Table 1.

Example 8

The same procedures as in Example 1 were followed, except for using 750 mmoles of bicyclo[2.2.1]hept-2-ene, 450 mmoles of endo-tricyclo[5.2.1.0$^{2,6}$]deca-8-ene (endo/exo ratio=96/4), and 50 mmoles of 8-methyl-8-carboxymethyltetracyclo-[4.4.0.1$^{2,5}$.1$^{7,10}$]dodeca-3- as monomers, to obtain a copolymer H in a conversion of 75%. In the copolymer H, a proportion of the structural unit derived from endo-tricyclo[5.2.1.0$^{2,6}$]deca-8-ene as determined from the $^1$H-NMR spectrum by the gas chromatographic analysis of the unreacted monomers was quantitatively determined to be 29 mol %. A proportion of the structural unit derived from 8-methyl-8-carboxymethyltetracyclo[4.4.0.1$^{2,5}$.1$^{7,10}$]dodeca-3-ene as determined from the $^1$H-NMR spectrum was 4 mol %. (This value was calculated from a ratio of the CH$_2$ absorption at 3.3–3.7 ppm to the absorption of all of other protons.) The copolymer H had a number average molecular weight of 89,000 and a weight average molecular weight of 177,000 as reduced into polystyrene, with an Mw/Mn ratio being 2.0. The results of the dissolution property and weight loss tests of the polymer H are shown in Table 1.

A film H-1 was prepared using the copolymer H in the same measure as in Example 1. The results of measurement of the glass transition temperature of the thus prepared film H-1 are shown in Table 1.

A coating film H-2 was obtained using the copolymer H in the same measure as in Example 1. The result of measurement of elastic modulus of the resulting coating film H-2 is shown in Table 1.

Example 9

Polymerization was carried out in the same manner as in Example 4, except for using 625 mmoles of bicyclo[2.2.1]hept-2-ene, 587 mmoles of endo-tricyclo[6.2.1.0$^{2,7}$]undeca-3,9-diene (endo/oxo=85/15), and 37 mmoles of 5-triethoxysilylbicyclo[2.2.1]hept-2-ene as monomers, to obtain a copolymer J in a conversion of 85%. In the copolymer J, a proportion of the structural unit derived from endo-tricyclo[6.2.1.0$^{2,7}$]undeca-3,9-diene as determined from the $^1$H-NMR spectrum was 33 mol %. A proportion of the structural unit derived from 5-triethoxysilylbicyclo[2.2.1]hept-2-ene was 3.0 mol %. The copolymer J had a number average molecular weight of 102,000 and a weight average molecular weight of 197,000 as reduced into polystyrene, with an Mw/Mn ratio being 1.9.

The copolymer J was hydrogenated in the same measure as in Example 2 to obtain a hydrogenated polymer JH. The polymer JH had a degree of hydrogenation of 99% as determined by the $^1$H-NMR measurement. The results of the dissolution property and weight loss tests of the polymer JH are shown in Table 1.

A film JH-1 was prepared using the copolymer JH in the same measure as in Example 1. The result of measurement of the glass transition temperature of the thus prepared film JH-1 is shown in Table 1.

A coating film JH-2 was obtained using the copolymer JH in the same measure as in Example 1. The result of measurement of elastic modulus of the resulting coating film JH-2 is shown in Table 1.

Example 10

Polymerization was carried out in the same measure as in Example 9, except for using 587 mmoles of tricyclo[8.2.1.0$^{2,9}$]trideca-3,11-diene (endo/exo=80/20) as a monomer in place of the endo-tricyclo[6.2.1.0$^{2,7}$]undeca-3,9-diene, to obtain a copolymer K in a conversion of 65%.

In the copolymer K, a proportion of the structural unit derived from tricyclo-[8.2.1.0$^{2,9}$]trideca-3,11-diene as determined from the $^1$H-NMR spectrum was 30 mol %. A proportion of the structural unit derived from 5-triethoxysilylbicyclo[2.2.1]hept-2-ene was 2.5 mol %. The copolymer K had a number average molecular weight of 83,000 and a weight average molecular weight of 167,000 as reduced into polystyrene, with an Mw/Mn ratio being 2.0.

The copolymer K was hydrogenated in the same measure as in Example 2 to obtain a hydrogenated polymer KH. The polymer KH had a degree of hydrogenation of 99% as determined by the $^1$H-NMR measurement. The results of the dissolution property and weight loss tests of the polymer KH are shown in Table 1.

A film KH-1 was prepared using the copolymer KH in the same measure as in Example 1. The result of measurement of the glass transition temperature of the thus prepared film KH-1 is shown in Table 1.

A coating film KH-2 was obtained using the copolymer KH in the same measure as in Example 1. The result of measurement of elastic modulus of the resulting coating film KH-2 is shown in Table 1.

Example 11

Polymerization was carried out in the same manner as in Example 4, except for using 700 mmoles of bicyclo[2.2.1]hept-2-ene, 570 mmoles of endo-tricyclo[5.2.1.0$^{2,6}$]deca-8-ene (endo/oxo=96/4), 30 mmoles of 5-triethoxysilylbicyclo[2.2.1]hept-2-ene, and 5 mmoles of 1-hexene as monomers and 400 g of cyclohexane and 100 g of methylene chloride as solvents, to obtain a copolymer L in a conversion of 92%. In the copolymer L, a proportion of the structural unit derived from 5-triethoxysilylbicyclo[2.2.1]hept-2-ene as determined from the $^1$H-NMR spectrum was 2.1 mol %. A proportion of the structural unit derived from endo-tricyclo[5.2.1.0$^{2,6}$]deca-8-ene as calculated from the gas chromatographic analysis of the unreacted monomers was 35 mol %. The copolymer L had a number average molecular weight of 89,000 and a weight average molecular weight of 187,000 as reduced into polystyrene, with an Mw/Mn ratio being 2.1. The results of the dissolution property and weight loss tests of the polymer L are shown in Table 1.

A film L-1 was prepared using the copolymer L in the same measure as in Example 1. The result of measurement of the glass transition temperature of the thus prepared film L-1 is shown in Table 1.

A coating film L-2 was obtained using the copolymer L in the same measure as in Example 1. The result of measurement of elastic modulus of the resulting coating film L-2 is shown in Table 1.

Example 12

Polymerization was carried out under the same condition as in Example 3, except for using 625 mmoles of bicyclo[2.2.1]hept-2-ene, 587 mmoles of exo-tricyclo[5.2.1.0$^{2,6}$]deca-3,8-diene (endo/oxo=4/96), and 37 mmoles of 5-[1',4',4'-trimethyl-2',6'-dioxa-1'-silacyclohexyl]bicyclo[2.2.1]hept-2-ene, to a copolymer M in a conversion of 75%. In the copolymer M, a proportion of the structural unit derived from exo-tricyclo[5.2.1.0$^{2,6}$]deca-3,8-diene as determined from the $^1$H-NMR spectrum was 24 mol %. A proportion of the structural unit derived from 5-[1',4',4'-trimethyl-2',6'-dioxa-1'-silacyclohexyl]bicyclo[2.2.1]hept-2-ene was mol %. The copolymer M had a number average molecular weight of 82,000 and a weight average molecular weight of 166,000 as reduced into polystyrene, with an Mw/Mn ratio being 2.0.

The copolymer M was hydrogenated in the same measure as in Example 3 to obtain a hydrogenated polymer MH. The polymer MH had a degree of hydrogenation of 99% as determined by the $^1$H-NMR measurement. The results of the dissolution property and weight loss tests of the polymer MH are shown in Table 1.

A film MH-1 was prepared using the copolymer MH in the same measure as in Example 1. The result of measurement of the glass transition temperature of the thus prepared film MH1 is shown in Table 1.

A coating film MH-2 was obtained using the copolymer MH in the same measure as in Example 1. The result of measurement of elastic modulus of the resulting coating film MH-2 is shown in Table 1.

Example 13

Polymerization was carried out in the same manner as in Example 11, except for using 560 mmoles of exo-tricyclo[5.2.1.0$^{2,6}$]deca-8-ene (endo/exo=10/90) as a monomer in place of the endo-tricyclo[5.2.1.0$^{2,6}$]deca-8-ene, to obtain a copolymer N in a conversion of 97%. In the copolymer N, a proportion of the structural unit derived from endo-tricyclo[5.2.1.0$^{2,6}$]deca-8-ene was quantitatively determined by the gas chromatographic analysis of the unreacted monomers and found to be 42 mol %. In the copolymer N, a proportion of the structural unit derived from 5-triethoxysilyl-bicyclo[2.2.1]hept-2-ene as determined from the $^1$H-NMR spectrum was 3.1 mol %. The copolymer N had a number average molecular weight of 119,000 and a weight average molecular weight of 250,000 as reduced into polystyrene, with an Mw/Mn ratio being 2.1. The results of the dissolution property and weight loss tests of the polymer N are shown in Table 1.

A film N-1 was prepared using the copolymer N in the same measure as in Example 1. The result of measurement of the glass transition temperature of the thus prepared film N-1 is shown in Table 1.

A coating film N-2 was obtained using the copolymer N in the same measure as in Example 1. The results of measurement of elastic modulus of the resulting coating film N-2 is shown in Table 1.

Example 14

Polymerization was carried out in the same manner as in Example 4, except for using 970 mmoles of bicyclo[2.2.1]hept-2-ene and 30 mmoles of 5-[1',4',4'-trimethyl-2',6'-dioxa-1'-silacyclohexyl]bicyclo[2.2.1]hept-2-ene as monomers, to obtain a copolymer P in a conversion of 98%. In the copolymer P, a proportion of the structural unit derived from 5-[1',4',4'-trimethyl-2',6'-dioxa-1'-silacyclohexyl]bicyclo[2.2.1]hept-2-ene as determined from the $^1$H-NMR spectrum was 2.8 mol %. The copolymer P had a number average molecular weight of 116,000 and a weight average molecular weight of 278,000 as reduced into polystyrene, with an Mw/Mn ratio being 2.4. The results of the dissolution property and weight loss tests of the polymer P are shown in Table 1.

A film P-1 was prepared using the copolymer P in the same measure as in Example 1. The result of measurement of the glass transition temperature of the thus prepared film P-1 is shown in Table 1.

A coating film P-2 was obtained using the copolymer P in the same measure as in Example 1. The result of measurement of elastic modulus of the resulting coating film P-2 is shown in Table 1.

Example 15

Polymerization was carried out in the same manner as in Example 2, except for using 1,200 mmoles of bicyclo[2.2.1]hept-2-ene, 50 mmoles of tricyclo[5.2.1.0$^{2,6}$]deca-3,8-diene having a proportion of the endo isomer of 99% or more, and 30 mmoles of 5-[1',4',4'-trimethyl-2',6'-dioxa-1'-silacyclohexyl]bicyclo-[2.2.1]hept-2-ene as monomers, to obtain a copolymer Q in a conversion of 98%. In the copolymer Q, a proportion of the structural unit derived from endo-tricyclo[5.2.1.0$^{2,6}$]-deca-3,8-diene as determined from the $^1$H-NMR spectrum was 4 mol %. A proportion of the structural unit derived from 5-[1',4',4'-trimethyl-2',6'-dioxa-1'-silacyclohexyl]bi-cyclo[2.2.1]hept-2-ene was 2.8 mol %. The copolymer Q had a number average molecular weight of 120,000 and a weight average molecular weight of 243,000 as reduced into polystyrene, with an Mw/Mn ratio being 2.0.

The copolymer Q was hydrogenated in the same measure as in Example 2 to obtain a hydrogenated polymer QH. The polymer QH had a degree of hydrogenation of 99% as determined by the $^1$H-NMR measurement. The results of the dissolution property and weight loss tests of the polymer QH are shown in Table 1.

A film QH-1 was prepared using the copolymer QH in the same measure as in Example 1. The result of measurement of the glass transition temperature of the thus prepared film QH-1 is shown in Table 1.

A coating film QH-2 was obtained using the copolymer QH in the same measure as in Example 1. The result of measurement of elastic modulus of the resulting coating film QH-2 is shown in Table 1.

Comparative Example 1

Polymerization was carried out in the same manner as in Example 2, except for using 625 mmoles of bicyclo[2.2.1]hept-2-ene, 587 mmoles of endo-tricyclo[5.2.1.0$^{2,6}$]deca-3,8-diene, and 38 mmoles of 5-[1',4',4'-trimethyl-2',6'-dioxa-1'-silacyclohexyl]bicyclo[2.2.1]hept-2-ene as monomers and using 300 mmoles of 1,3-butadiene in place of the 1-hexene, to obtain a copolymer S in a conversion of 65%. In the copolymer S, a proportion of the structural unit derived from endo-tricyclo[5.2.1.0$^{2,6}$]deca-3,8-diene as determined from the $^1$H-NMR spectrum was 37 mol %. A proportion of the structural unit derived from 5-[1',4',4'-trimethyl-2',6'-dioxa-1'-silacyclohexyl]bicyclo[2.2.1]hept-2-ene was 2.5 mol %. The copolymer S had a number average molecular weight of 8,500 and a weight average molecular weight of 16,800 as reduced into polystyrene, with an Mw/Mn ratio being 2.0.

The copolymer S was hydrogenated in the same measure as in Example 2 to obtain a hydrogenated polymer SH in a degree of hydrogenation of 99%. The results of the dissolution property and weight loss tests of the polymer SH are shown in Table 1.

A film SH-1 was prepared using the copolymer SH in the same measure as in Example 1. This film was very brittle so that it was broken even by a few of external force. Accordingly, it was impossible to measure the glass transition temperature.

A coating film SH-2 was obtained using the copolymer SH in the same measure as in Example 1. The result of measurement of elastic modulus of the resulting coating film SH-2 is shown in Table 1.

TABLE 1

| | Number average molecular weight G/mole | Dissolution property | | | | Weight loss (%) | | | Elastic modulus (GPa) |
| --- | --- | --- | --- | --- | --- | --- | --- | --- | --- |
| | | Toluene | Mesitylene | Cyclohexane | Chlorobenzene | 350° C. | 500° C. | (° C.) | |
| Example 1 | 82000 | E | E | E | E | 1.2 | 97.2 | 375 | 4.1 |
| Example 2 | 60000 | E | E | E | E | 1.3 | 97.5 | 365 | 4.2 |
| Example 3 | 116000 | E | E | E | E | 0.9 | 98.0 | 380 | 4.2 |
| Example 4 | 112000 | E | E | E | E | 1.1 | 97.7 | 370 | 4.0 |
| Example 5 | 108000 | E | E | E | E | 0.9 | 98.2 | 375 | 4.2 |
| Example 6 | 72000 | E | E | E | E | 1.2 | 97.5 | 380 | 4.0 |

TABLE 1-continued

| | Number average molecular weight G/mole | Dissolution property | | | | Weight loss (%) | | Elastic modulus | |
| --- | --- | --- | --- | --- | --- | --- | --- | --- | --- |
| | | Toluene | Mesitylene | Cyclohexane | Chlorobenzene | 350° C. | 500° C. | (° C.) | (GPa) |
| Example 7 | 72000 | Æ | Æ | Æ | Æ | 1.1 | 98.3 | 360 | 4.1 |
| Example 8 | 89000 | Æ | Æ | Æ | Æ | 4.4 | 97.0 | 390 | 3.6 |
| Example 9 | 102000 | Æ | Æ | Æ | Æ | 2.0 | 97.1 | 365 | 3.8 |
| Example 10 | 83000 | Æ | Æ | Æ | Æ | 3.2 | 97.9 | 355 | 3.4 |
| Example 11 | 89000 | Æ | Æ | Æ | Æ | 1.1 | 98.1 | 375 | 4.0 |
| Example 12 | 82000 | Æ | Æ | Æ | Æ | 1.2 | 97.7 | 390 | 3.9 |
| Example 13 | 119000 | Æ | Æ | Æ | Æ | 1.5 | 98.0 | 360 | 4.1 |
| Example 14 | 116000 | Æ | Æ | X | Æ | 0.8 | 98.2 | 360 | 4.3 |
| Example 15 | 120000 | Æ | Æ | Æ | Æ | 1.2 | 97.6 | 365 | 3.8 |
| Comparative Example 1 | 8500 | Æ | Æ | Æ | Æ | 3.2 | 98.0 | — | 2.7 |

The invention provides a heat decomposable cyclic olefin based addition polymer capable of revealing a specific heat resistant temperature and a specific heat decomposition temperature by having a specific repeating unit structure and a specific molecular weight range, and a process of producing the same. The cyclic olefin based addition polymer of the invention can be removed only by simple heat treatment without necessity of an operation such as etching and icing and has a mechanical strength that is sufficiently adaptive to the wiring processing process at temperatures not higher than the heat resistant temperature. Accordingly, it is possible to readily form a cavity structure between metallic wirings in semiconductors, etc. by using the cyclic olefin based addition polymer of the invention.

What is claimed is:

1. A method of forming a cavity between multilayered wirings, which comprises
a step of coating the surface of a first dielectric film formed on a semiconductor substrate with a cyclic olefin based addition copolymer containing at least one repeating unit selected from the group consisting of repeating units represented by the following general formulae (1) to (3) and at least one repeating unit selected from the group consisting of repeating units represented by the following general formulae (4) to (7):

General formula (1)

wherein $A^1$ to $A^4$ each independently represents a hydrogen atom, a halogen atom, a hydrocarbon group having 1–10 carbon atoms or a halogenated hydrocarbon group having 1–10 carbon atoms; and m is 0 or 1,

General formula (2)

wherein $A^1$ to $A^4$ and m are the same as defined in the formula (1),

General formula (3)

wherein $B^1$ to $B^4$ each independently represents a hydrogen atom, a halogen atom, a hydrocarbon group having 1–10 carbon atoms, a halogenated hydrocarbon group having 1–10 carbon atoms, a hydrolyzable silyl group, or a polar group represented by —$(CH_2)_kX$; at least one of $B^1$ to $B^4$ represents a hydrolyzable silyl group or a polar group represented by —$(CH_2)_kX$; X represents —$C(O)OR^{21}$ or —$OC(O)R^{22}$; $R^{21}$ and $R^{22}$ each represents hydrogen, a hydrocarbon group having 1–10 carbon atoms or a halogenated hydrocarbon group having 1–10 carbon atoms; k represents an integer of 0–3; $B^1$ to $B^4$ may be a hydrocarbon ring or a heterocyclic structure formed by $B^1$ and $B^3$ or $B^2$ and $B^4$, or an alkylidenyl, an imide or a carboxylic anhydride formed by $B^1$ and $B^2$ or $B^3$ and $B^4$; and p represents an integer of 0–2,

General formula (4)

wherein $R^1$ to $R^{14}$ each independently represents a hydrogen atom, a halogen atom, a hydrocarbon group having 1–10 carbon atoms or a halogenated hydrocarbon group having 1–10 carbon atoms,

General formula (5)

wherein $R^1$ to $R^{12}$ each independently represents a hydrogen atom, a halogen atom, a hydrocarbon group having 1–10 carbon atoms or a halogenated hydrocarbon group having 1–10 carbon atoms, General formula (6)

wherein $R^1$ to $R^{16}$ each independently represents a hydrogen atom, a halogen atom, a hydrocarbon group having 1–10 carbon atoms or a halogenated hydrocarbon group having 1–10 carbon atoms, and General formula (7)

wherein $R^1$ to $R^{20}$ each independently represents a hydrogen atom, a halogen atom, a hydrocarbon group having 1–10 carbon atoms or a halogenated hydrocarbon group having 1–10 carbon atoms, a step of patterning the cyclic olefin based addition polymer as a void-forming polymer, a step of forming a metallic wiring in the pattern formed on the void-forming polymer, a step of forming a second dielectric film on the void-forming polymer containing a metallic wiring, and a step of removing the void-forming polymer between the multilayered wirings by heating to form a cavity between the metallic wirings.

2. The method as claimed in claim 1, wherein the cyclic olefin based addition copolymer contains 20 mol % or more of the repeating unit represented by the general formula (1) and/or general formula (2).

3. The method as claimed in claim 1, wherein the cyclic olefin based addition copolymer contains 50 mol % or less of the repeating unit represented by the general formula (3).

4. The method as claimed in claim 1, wherein the cyclic olefin based addition copolymer contains repeating units represented by general formula (3) containing a hydrolyzable silyl group, as the hydrolyzable group, which is a group represented by the following general formula (8) or (9):

General formula (8)

$$—(CR^{23}R^{24})_n—SiR^{26}R^{27}R^{28}$$ General formula (9)

wherein $R^{23}$, $R^{24}$, and $R^{25}$ each independently represents a hydrogen atom, an alkyl group having 1–6 carbon atoms, a cycloalkyl group having 3–6 carbon atoms or an aryl group having 4–6 carbon atoms; $R^{26}$, $R^{27}$, and $R^{28}$ each independently represents a hydrogen atom, an alkyl group having 1–6 carbon atoms, a cycloalkyl group having 3–6 carbon atoms, an aryl group having 4–6 carbon atoms, an alkoxy group having 1–6 carbon atoms or an aryloxy group having 4–6 carbon atoms, or a halogen atom; n represents an integer of 0–5; and Y represents a hydrocarbon residue of an aliphatic diol, an alicyclic diol or an aromatic diol, having 2–26 carbon atoms.

5. The method as claimed in claim 1, wherein the cyclic olefin based addition copolymer has a weight loss on heating at 350° C. for one hour in an inert gas atmosphere and/or a vacuum atmosphere of 5 wt % or less and a weight loss on heating at 500° C. for one hour in an inert gas atmosphere and/or a vacuum atmosphere of 80 wt % or more.

6. The method as claimed in claim 1, 2, 3 or 4, wherein the cyclic olefin based addition copolymer has a glass transition temperature of 300° C. or higher.

7. The method as claimed in claim 1, wherein the cyclic olefin based addition copolymer has an elastic modulus at 25° C. of 3 GPa or more.

* * * * *